United States Patent [19]

Elam et al.

[11] 4,162,349
[45] Jul. 24, 1979

[54] FABRICATION OF Co-Cr-Al-Y FEED STOCK

[75] Inventors: Richard C. Elam, Manchester; Nicholas E. Ulion, Marlborough, both of Conn.

[73] Assignee: United Technologies Corporation, Hartford, Conn.

[21] Appl. No.: 861,031

[22] Filed: Dec. 15, 1977

Related U.S. Application Data

[63] Continuation of Ser. No. 800,112, May 24, 1977, Pat. No. 4,110,893, which is a continuation-in-part of Ser. No. 582,036, May 29, 1975, abandoned, Ser. No. 739,213, November 5, 1976, abandoned, is a division of said Ser. 582,036.

[51] Int. Cl.² ........................................ B21F; B22F 3/24
[52] U.S. Cl. ................................. 428/614; 428/668; 428/678; 75/171; 29/420.5; 427/250
[58] Field of Search .............. 428/655, 614, 668, 678; 29/420.5, 420, 191.4, 191; 219/45, 46; 75/135, 226, 224, 225, 212, 211, 214, 208 CS; 427/248 B, 42, 250

[56] References Cited

U.S. PATENT DOCUMENTS

| | | | |
|---|---|---|---|
| 2,433,687 | 12/1947 | Durst | 428/668 |
| 2,592,115 | 4/1952 | Carroll | 428/655 |
| 2,595,292 | 5/1952 | Reece | 75/135 X |
| 2,854,738 | 10/1958 | Gray | 428/655 |
| 2,872,179 | 2/1959 | Fisher | 428/655 |
| 3,564,940 | 2/1971 | Thompson et al. | 75/135 |
| 3,565,602 | 2/1971 | Konisi et al. | 75/135 X |
| 3,667,421 | 6/1972 | Bala et al. | 118/9 |
| 3,918,139 | 11/1975 | Felten | 428/655 |
| 3,938,964 | 2/1976 | Schmidt | 29/191.4 |
| 3,958,327 | 5/1976 | Marancik | 29/599 |

FOREIGN PATENT DOCUMENTS 933500  8/1963  United Kingdom .................... 29/420.5

Primary Examiner—Lowell A. Larson
Assistant Examiner—V. K. Rising
Attorney, Agent, or Firm—Charles A. Warren

[57] ABSTRACT

The process of making an ingot for use as a feed stock for a coating process in which the ingot is vaporized to produce the coating material; the ingot being made by forming a billet of the alloy minus the reactive element with a rod of the reactive element of the alloy extending centrally through the billet and then shaping the billet to ingot size, the cross-sectional area of the rod having the same relation of the remainder of the area of the billet as the percentage of the reactive element in the alloy.

2 Claims, 4 Drawing Figures

FABRICATION OF Co-Cr-Al-Y FEED STOCK

This is a continuation of Ser. No. 800,112 filed May 24, 1977 now U.S. Pat. No. 3,110,893, which is a continuation-in-part of Ser. No. 582,036 filed May 29, 1975 now abandoned, of which Ser. No. 739,213 filed Nov. 5, 1976 now abandoned is a division.

SUMMARY OF THE INVENTION

For adequate protection of some alloys exposed to heat and corrosive gases, such as some of the high temperature alloys in gas turbines, a protective coating for the alloys has been found to provide significantly longer life for the turbine parts. This is particularly true of turbine blades and vanes. Such a coating is regularly applied by vapor deposition of the coating alloy, the vapor produced as by electron beam vaporization, in a vacuum, of an ingot made of the coating alloy as described, for example, in Bleckerman et al U.S. Pat. No. 3,620,815 or Bala et al U.S. Pat. No. 3,667,421. One problem has been the preparation of the ingot to be evaporated, especially when one of the elements of the alloy is reactive such as yttrium, hafnium or other elements of this type. The coating, to be most effective, must have such reactive element or elements present in a precise percentage and thus the ingot must have the proper amount of this reactive element.

To obtain the desired composition the ingots are presently produced by investment casting the desired alloy and then machining the casting to ingot size. Such techniques are much more expensive than casting large billets and subsequent extrusion to size. With certain alloys, however, the presence of second phases associated with the reactive element of the alloy makes this latter technique impractical.

Further, some of these alloys with the reactive element cast in are very difficult to extrude into ingot size and shape for use in vapor deposition. Also in making the casting, the reactive element promotes decomposition of the crucible material by reacting with it, frequently resulting in impurities in the casting and loss of the desired quantity of the element in the finished casting. Additional quantities of the reactive element in the crucible added during melting to compensate for the lost quantity of the element merely increase the detrimental effects. The reactive element, particularly yttrium also tends to segregate in the casting and can produce compositional variations in the vapor during the coating process.

The presence of impurities in the ingot, as from the decomposition of the crucible during casting, can cause eruptions in the pool of molten alloy during vapor deposition, thereby introducing globules of molten pool alloy on the coated part. These particles can cause rejection of the finished part. Although the coating on the rejected part may be stripped and the part recoated, it is an expensive process and greatly increases the cost of the finished part.

The present invention avoids these problems by forming a large billet as by casting the alloy minus the reactive element, placing the reactive element in a form of a wire or rod in an axially extending hole in the casting, and then extruding the billet to the desired dimension for the ingot. The diameter of the rod or wire of the reactive element provides a cross-sectional area that has the same relation to the area of the billet as the proportion of the reactive element in the alloy. The resulting ingot thus has the composition required in the coating alloy. Although the reactive element is desirably located centrally of the ingot it is not necessarily so located so long as it extends axially of the ingot and with the proper cross-sectional area.

The billet may have a cored hole to receive a rod of the reactive element. Alternatively, certain alloys which are machinable without the reactive element present may have the center hole drilled or the billet may be split, a groove machined in the matching faces, and the halves of the billet then put back together around the central rod.

The ingot to be used in vapor deposition may be made by other techniques as by forming powdered alloy into ingot shape by hot isostatic pressing. In this event, the powdered alloy, minus the reactive element, is encapsulated in a container of a material not reactive to the alloy and capable of withstanding the temperatures and pressures of the heating and pressing treatment necessary in forming the ingot. In this technique the rod of reactive metal is positioned centrally of the powdered alloy in the capsule and is thus centrally located during the forming of the ingot to shape.

The result is a simplified procedure for producing a usable ingot for vapor deposition in which the reactive element is separate from the rest of the metals of the alloy during the forming of the ingot to finished shape thereby avoiding both loss of this element and undesirable second phases in the alloy and precise control of the percentage of the reactive element in the ingot. With the desired percentage of the reactive element in the ingot, the same percentage will be in the coating vapor and in the coating on the coated article. The ingot of the invention also assures a greater homogeneity in the coating and the proper quantity of the reactive element throughout the length of the ingot.

The foregoing and other objects, features and advantages of the present invention will become more apparent in the light of the following detailed description of preferred embodiments thereof as illustrated in the accompanying drawing.

DESCRIPTION OF THE PREFERRED EMBODIMENT

Figure 1:
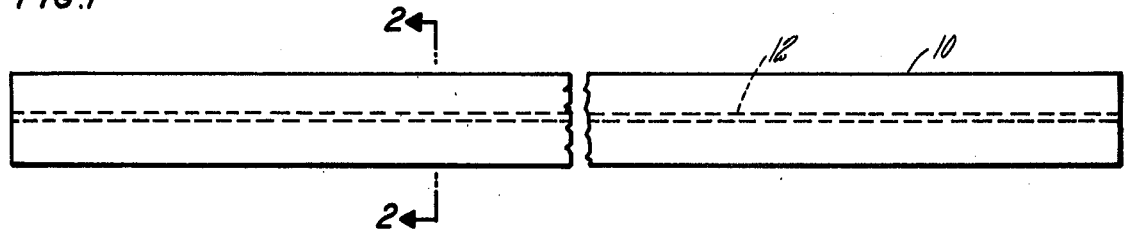
FIG. 1 is a side elevation of the finished ingot.
Figure 2:
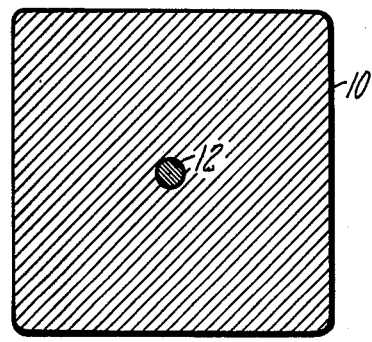
FIG. 2 is a sectional view along line 2—2 of FIG. 1.

The ingot of the present invention is shown in FIGS. 1 and 2 as rectangular in cross section to fit the crucible into which the ingot is fed. Such crucibles as well as the coating technique are well known as described in U.S. Pat. No. to Bala et al 3,667,421 above mentioned, in which the ingot is fed upwardly into a bottom-feed crucible, is melted by an electron beam to provide an alloy vapor in a vacuum chamber in which the piece or pieces to be coated are positioned.

Thus the ingot 10, shown as rectangular in cross section, but which may be any other cross-sectional shape to fit the crucible, has a centrally located rod or wire 12 of the reactive element of the alloy. This wire 12 extends the entire length of the ingot and has a cross-sectional area having a ratio to the remainder of the area of the ingot comparable to the percentage of the reactive element in the alloy. One of the alloys in regular use is a chromium, cobalt, and aluminum alloy to which yttrium is added as the reactive element. This alloy is well known and is in use and is a part of the invention only as it relates to the particular composition of the ingot and to the process for making the ingot. Other alloys to which invention is applicable are alloys of either iron or nickel, or both nickel and cobalt or iron and cobalt with chromium and aluminum. These alloys are well known; the use of a reactive element such as yttrium improves the durability and performance of the vapor deposited coating using these alloys.

The invention process will be described with respect to the alloy known as Co-Cr-Al-Y. Obviously, other alloys and other reactive elements could well be used in producing the ingot of this invention; the essential feature to enclose the reactive element within the ingot so the reactive element will be present in the proper proportion in the ingot without being mixed with the other metals of the alloy of the ingot. The ingot is made by first casting a large billet of chromium, cobalt, and aluminum in the proper proportions to produce the alloy minus the reactive element. This billet 10 has a hole 14 therein extending axially the entire length of the billet and preferably centrally of the billet. The wire or rod 12 of the reactive element yttrium is positioned within this hole, preferably substantially filling the opening. This rod or wire may be formed by any well-known process, as by rolling or drawing, yttrium by itself being quite ductile. The area of the hole, and thus the wire therein, has the same relation to the total area of the billet as the portion of the reactive element to the total alloy. Thus for any cross section of the billet the chemical analysis would be that of the coating alloy.

The hole in the casting may be made in any of several ways. It may be formed by a core positioned in the mold during casting of the billet, and this is particularly desirable when the alloy of the billet is not readily machinable. Alternatively, if the billet alloy can be machined to some extent, the billet may be cast solid and then split lengthwise. A groove is then milled or otherwise cut in each of the halves of the ingot and the halves are then assembled around the reactive element. For more readily machinable alloys, the ingot may be drilled to receive the rod.

The billet with the rod of the reactive element therein is then extruded to produce an ingot of the desired shape and dimension for the crucible. Because the alloy without the reactive element is more workable, it is possible to extrude the two-piece billet to ingot dimensions, the reactive element being generally readily worked by extrusion. During the extrusion the reactive element is protected from oxidation or other contamination by the surrounding alloy and the result is a usable ingot with the proper quantity of reactive element at all sections of the ingot. When the ingot is then fed into the crucible, the resulting coating vapors will have the desired composition for most effective protection of the coated article.

The reactive element is shown and described as being centrally located within the ingot. This is an advantage in melting by electron beam in the crucible and in vaporizing the alloy in that the concentration of the beam is greatest centrally of the crucible. It has been found that the convective currents developing in the molten alloy will assure mixing of the reactive element with the rest of the alloy. Where the requirements of the quality of the coating applied by the vaporization of the alloy are less straight, it may be acceptable to use an ingot in which the reactive element is inserted in a groove milled or otherwise formed in the wall of the billet before extrusion. In this event, the ratios of the cross-sectional area will be maintained as above described. Such a billet and the resulting ingot can be produced as readily as the billet with a reactive element centrally of the billet and is equally readily extruded to ingot shape and dimension.

Although the billet is described above as cast it may be produced in other ways as by making an encapsulated billet from the alloy in powdered form minus the reactive element, with a wire or rod of the reactive element then positioned in the encapsulated powder, preferably centrally, the rod extending axially of the encapsulated powder from end to end. In making an ingot by this technique, the powdered alloy is placed in a capsule of a material that is not reactive with the alloy and that will withstand the pressures and temperatures of the hot isostatic pressure technique used in making the ingot. Glass or metal may be used for this purpose, although other material may be usable. The capsule is filled with the powdered alloy with the reactive rod positioned therein either before or after the powdered alloy is in the capsule. In either case, the rod is located within a passage in the powdered alloy, the rod forming the passage in the alloy either as the powdered alloy is placed around it or by forcing the powdered alloy aside if the rod is inserted into the filled capsule. After filling, the capsule is evacuated and sealed so that the powder is in a vacuum.

The cross-sectional area of the rod in this case will have the same proportion to the compacted area of the surrounding alloy as the percentage of the reactive element in the alloy. Since the rod is already in solid form it is not significantly compacted during the subsequent heating and pressing of the material and is not significantly changed in dimension. In making the ingot in this way there is no extrusion of the material as such and the finished ingot is the same length as the length of the powdered alloy in the capsule.

The capsule, with the rod and powdered metal sealed therein in a vacuum is then formed to size by hot isostatic pressure techniques. To do this, the capsule is placed in an autoclave and heated under such a pressure that the powder will be compacted into solid form, with the elimination of most of the voids therein. The dimension of the capsule is selected so that when the powdered alloy is compacted to the desired extent it will have reached the desired ingot dimension in cross section. One advantage of this technique is that the finished ingot cross section may be controlled accurately enough to assure a proper fit within the bottom opening of the vaporizing crucible without a need for further shaping the outer surface of the ingot to more precise dimension.

Figure 3:
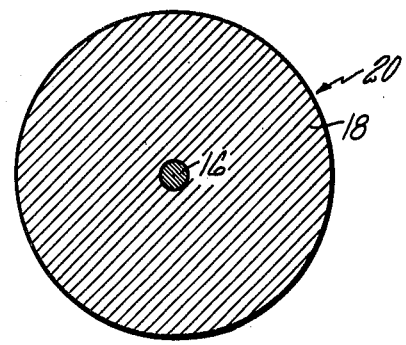
FIG. 3 is a sectional view of another ingot.

An ingot made in this way may have the configuration of FIG. 3. In this figure, the reactive rod 16 is enclosed within the surrounding compacted alloy material 18 to form the complete ingot 20. The outer periphery of the ingot is shown as circular to fit in a circular bottom opening in the melting crucible used in the coating process. This ingot, as above stated, has a rod cross section related to the cross section of the remainder of the ingot to correspond to the percentage of the reactive element in the coating alloy. When this ingot is completed, the ingot has the reactive element so enclosed that it will produce the proper quantity of this element as the ingot is melted for the coating operation.

Figure 4:
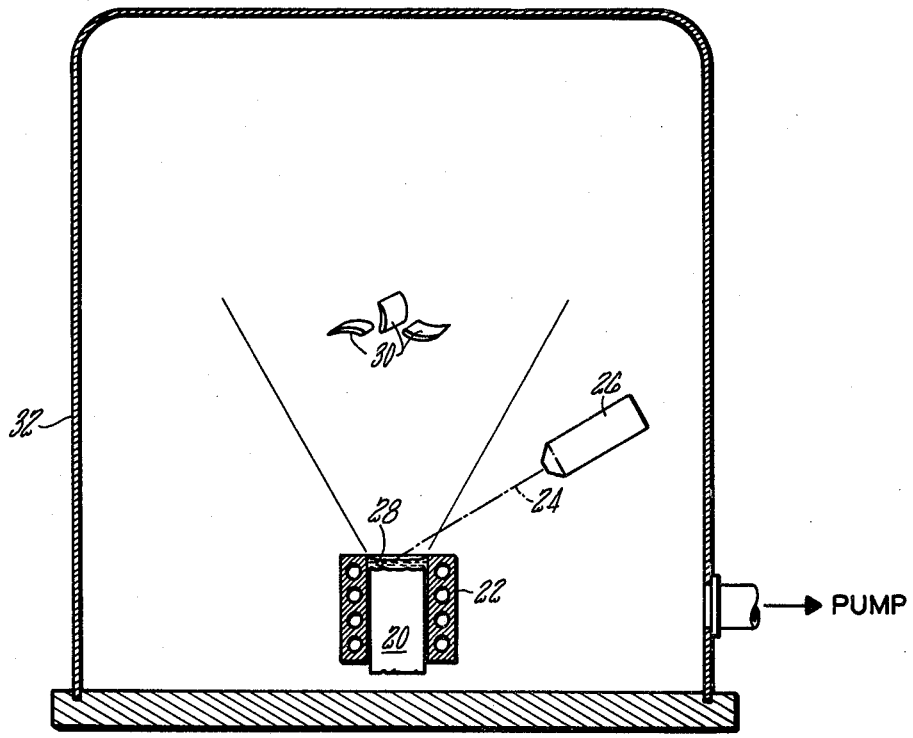
FIG. 4 is a schematic view of the coating process using this ingot.

After the ingot is prepared as above described, it is used in a vapor coating process as shown schematically in FIG. 4. As shown, the ingot 20 is fed upwardly through a crucible 22 which is preferably water cooled as shown. A suitable mechanism feeds the ingot vertically. The top surface of the ingot is exposed to an electron beam 24 from an electron beam gun 26. This melts the surface of the ingot to form a pool 28 of alloy from which a vapor cloud of alloy is evaporated and this cloud envelops the workpieces 30 that are to be coated. Because the relationship of the core or rod of reactive material in the ingot to the surrounding alloy is properly determined, the resulting cloud of vapor surrounding the workpieces, shown as turbine blades, has the desired composition to produce the most effective coating on these workpieces. The details of this coating process are well known. The importance of the present invention is that it provides a vapor cloud of the correct chemistry to deposit an acceptable coating on the workpiece without any impurities resulting from reaction of the reactive element with the crucible, in the billet making process eliminating objectionable deposits from any eruptions from the molten pool.

Although the invention has been described with respect to Co-Cr-Al-Y it should be understood that it is equally applicable to any other alloy having a reactive element where the reactive element is ductile and where the alloy minus the reactive element is castable and adequately ductile for extrusion of the composite billet.

We claim:

1. An ingot for use as feed stock in a coating operation, in which the ingot is vaporized in a crucible, said ingot being of a shape and dimension to fit the crucible, said ingot being a coating alloy including chromium, cobalt, and aluminum and also including a reactive element yttrium, the alloy not being readily workable whereas the reactive element is workable and the alloy without the reactive element is workable, said ingot having a centrally extending rod of the reactive element yttrium, the remainder of the ingot including chromium, cobalt, and aluminum without the reactive element yttrium and having the proper proportion of these elements of the alloy therein, the ratio of the cross-sectional area of the rod to the cross-sectional area of the remainder of the ingot being substantially the percentage of the reactive element yttrium in the alloy, thereby assuring the desired percentage of the reactive element in the vapor produced for the coating operation, the ingot when completed being melted and vaporized for a coating operation.

2. An ingot as in claim 1 in which the ingot is shaped to dimension from a billet, and the enclosure of the rod by the surrounding ingot and with the remainder of the alloy free of the reactive element permits working of both the rod and the remainder of the billet to form the ingot, the cross-sectional area of which has the proper composition of the alloy to produce, when vaporized, a vapor having the desired composition.

* * * * *

UNITED STATES PATENT AND TRADEMARK OFFICE
CERTIFICATE OF CORRECTION

PATENT NO. : 4,162,349
DATED : July 24, 1979
INVENTOR(S) : Richard C. Elam and Nicholas E. Ulion It is certified that error appears in the above—identified patent and that said Letters Patent are hereby corrected as shown below:

Column 5, line 11: after the word "coated." insert the sentence --The process is carried out in a vacuum chamber 32.--.

Signed and Sealed this

Sixteenth Day of October 1979

[SEAL]

Attest:

RUTH C. MASON
Attesting Officer

LUTRELLE F. PARKER
Acting Commissioner of Patents and Trademarks